United States Patent
Ridgeway et al.

(10) Patent No.: US 6,228,175 B1
(45) Date of Patent: May 8, 2001

(54) APPARATUS FOR GENERATING A WET OXYGEN STREAM FOR A SEMICONDUCTOR PROCESSING FURNACE

(76) Inventors: Kent Ridgeway, 8617 W. Cavalier Dr., Glendale, AZ (US) 85305; Richard B. Ricker, 3470 Owl Stick Rd., Cornville, AZ (US) 86325; Robert W. Howard, 4302 W. Paradise La., Glendale, AZ (US) 85306

(*) Notice: Subject to any disclaimer, the term of this patent is extended or adjusted under 35 U.S.C. 154(b) by 0 days.

(21) Appl. No.: 09/615,141

(22) Filed: Jul. 13, 2000

Related U.S. Application Data

(60) Provisional application No. 60/156,748, filed on Sep. 30, 1999.

(51) Int. Cl.[7] .................................................. C23C 16/00
(52) U.S. Cl. ........................... 118/726; 392/400; 392/402
(58) Field of Search .......................... 118/726; 392/395, 392/399, 400, 401, 402

(56) References Cited

U.S. PATENT DOCUMENTS

| | | | |
|---|---|---|---|
| 3,778,593 | * 12/1973 | Wikstrom | 392/402 |
| 5,467,424 | * 11/1995 | Davies | 392/401 |

* cited by examiner

Primary Examiner—Richard Bueker

(57) ABSTRACT

Apparatus for producing a wet oxygen stream for a semiconductor furnace to form oxide layers on silicon wafers. A quartz vessel with quartz chips is heated to 450° C. and a mixture of water and oxygen is introduced at the bottom of the vessel. Vaporization occurs at the input of the water and oxygen into the vessel. The output of wet oxygen as superheated stream passes through the chips and is taken from the top of the vessel to the furnace. The quartz vessel is nested in an aluminum body containing heaters to maintain constant temperature. The ratio of water vapor to oxygen in the wet stream is constant to produce layers of predictable characteristics.

11 Claims, 2 Drawing Sheets

APPARATUS FOR GENERATING A WET OXYGEN STREAM FOR A SEMICONDUCTOR PROCESSING FURNACE

CROSS REFERENCE TO RELATED APPLICATION

The present application is based on provisional patent application Serial No. 60/156,748 filed Sep. 30, 1999.

BACKGROUND OF THE INVENTION

This invention is directed to apparatus for generating a heated stream of oxygen and water vapor for use in connection with semiconductor processing equipment. In particular, the heated stream of oxygen and water vapor is used to grow thermal oxide films ($S_iO_2$) on semiconductor wafers and also is suitable for use in the deposition of oxide films.

The oxidation of silicon plays a significant part in the use of integrated silicon device technology. The role of the oxide began with the formation of diffusion masks, extended to the use of the oxide as a protective layer and moved on in significance to the use of oxide in integrated circuits. When silicon is exposed to an oxidizing gas, such as oxygen or water vapor, at an elevated temperature, an oxide forms on the surface. An oxide so formed is termed a thermal oxide and is grown on silicon surfaces prepared by chemical or mechanical surface preparation techniques.

While the formation of an oxide layer on silicon can be accomplished using high temperature water vapor or dry oxygen, wet oxygen oxidation wherein an oxygen stream is combined with water vapor provides additional flexibility in the layer formation. The water content of the gaseous stream supplied to the furnace containing the wafers is an important variable for determining oxide thickness. Uniformity and predictability of the characteristics of the oxide layer are dependent on maintaining the ratio of oxygen and water vapor constant.

Typically, the dry tank oxygen is passed through a water bath prior to being introduced into the oxidation furnace. The oxygen travels upwardly through the water vessel with the result that the ratio of oxygen to water is determined in part by the length of the path through the water. As the water level in the vessel changes, the path length of the oxygen gas changes as well and the ratio of the components of the output steam varies as well. The result is that the time required to form an oxide layer of desired thickness is often unpredictable.

An alternative to the passage of an oxygen stream through a water vessel over a period of several hours is the use of controlled hydrogen and oxygen streams combined in a pyrogenic reaction taking place within the furnace. This process typically requires expensive mass flow measurement and ratio control apparatus for each gas stream as well as an under-temperature shut down system. In addition, the safety standards for use of hydrogen in the clean room of a manufacturing facility require extensive shielding. The costs involved in conforming the facility to the local codes and ordinances reduces the desirability of this method of forming an oxide layer on silicon wafers.

Accordingly, the present invention is directed to apparatus for use in the generation of a wet oxygen stream for use in the manufacture of semiconductor components wherein the ratio of water and oxygen is constant during the generation of the stream. Further, the apparatus permits the establishment of the desired ratio prior to introduction of the oxygen and water into a vaporizing vessel. The ability to control the ratio over an extended period of many hours is found to improve the predictability and uniformity of oxide layer formed. The use of this apparatus eliminates the need to modify the facility to conform to safety requirements and thus provides a significant advantage when contrasted with apparatus using a stream of hydrogen to form an oxide layer.

SUMMARY OF THE INVENTION

The invention is directed to the generation of a wet stream of oxygen to be used in a semiconductor furnace for the production of oxide films on semiconductor wafers. The apparatus which is the subject of the present invention utilizes a mixture of water and oxygen injected into a high temperature vessel to produce a gas stream supplied to the semiconductor furnace.

The apparatus includes a quartz vessel open at the top which is nested in a body of high thermal conductivity material. The vessel is in contact with the body. Within the body are inserted means for heating the combination of body and vessel to an elevated temperature of the order of 450° C. A quartz cover having input and output ports is used to close the vessel.

An input tube which contains a mixture of oxygen and water at a predetermined ratio extends from the input port in the quartz cover to a level proximate to the bottom of the vessel. The vessel is substantially filled by chips of inert material so that the chips surround the input tube. The quartz cover includes an output port which contains an output tube that extends downwardly from the port a short distance to a region proximate to the underside of the cover.

During operation, the vessel is first purged and partially heated. The heaters embedded in the body then serve to elevate the temperature of the vessel and the inert chips contained therein. The input tube is then used to deliver a mixture of oxygen and water to the bottom of the vessel. The heating of the vessel and the inert chips to an elevated temperature causes essentially instantaneous vaporization of the water. The flow rate and mixture ratio of oxygen and water are preselected in accordance with the desired growth rate of the oxide film to be produced. The output tube is coupled to the semiconductor furnace.

In contrast to the bubbling of an oxygen stream through a water containing vessel wherein the oxygen and water vapor ratio varies as the process continues, the present apparatus enables the operator to regulate both the ratio and flow rate if desired. Should variation of these parameters not be desired, the flow rate and oxygen-water ratio can be maintained for the period necessary to grow the desired thickness of oxide layer. The use of this apparatus to grow oxide layers enables the operator to control the process by external adjustment.

Alternatively, the apparatus can be used in the deposition of a silicon dioxide layer on the surface of a semiconductor wafer. The input combination of water and oxygen is replaced by nitrogen and tetraethyl orthosilicate (TEOS). The TEOS is vaporized and exits the apparatus mixed with the nitrogen. Oxygen is injected into the output line downstream of the apparatus. The final mixture is provided to the furnace wherein deposition of the oxide film takes place.

Further features and advantages of the invention will become more readily apparent from the following detailed description of a preferred embodiment when taken in conjunction with the accompanying drawings.

DESCRIPTION OF THE PREFERRED EMBODIMENT

Figure 1:
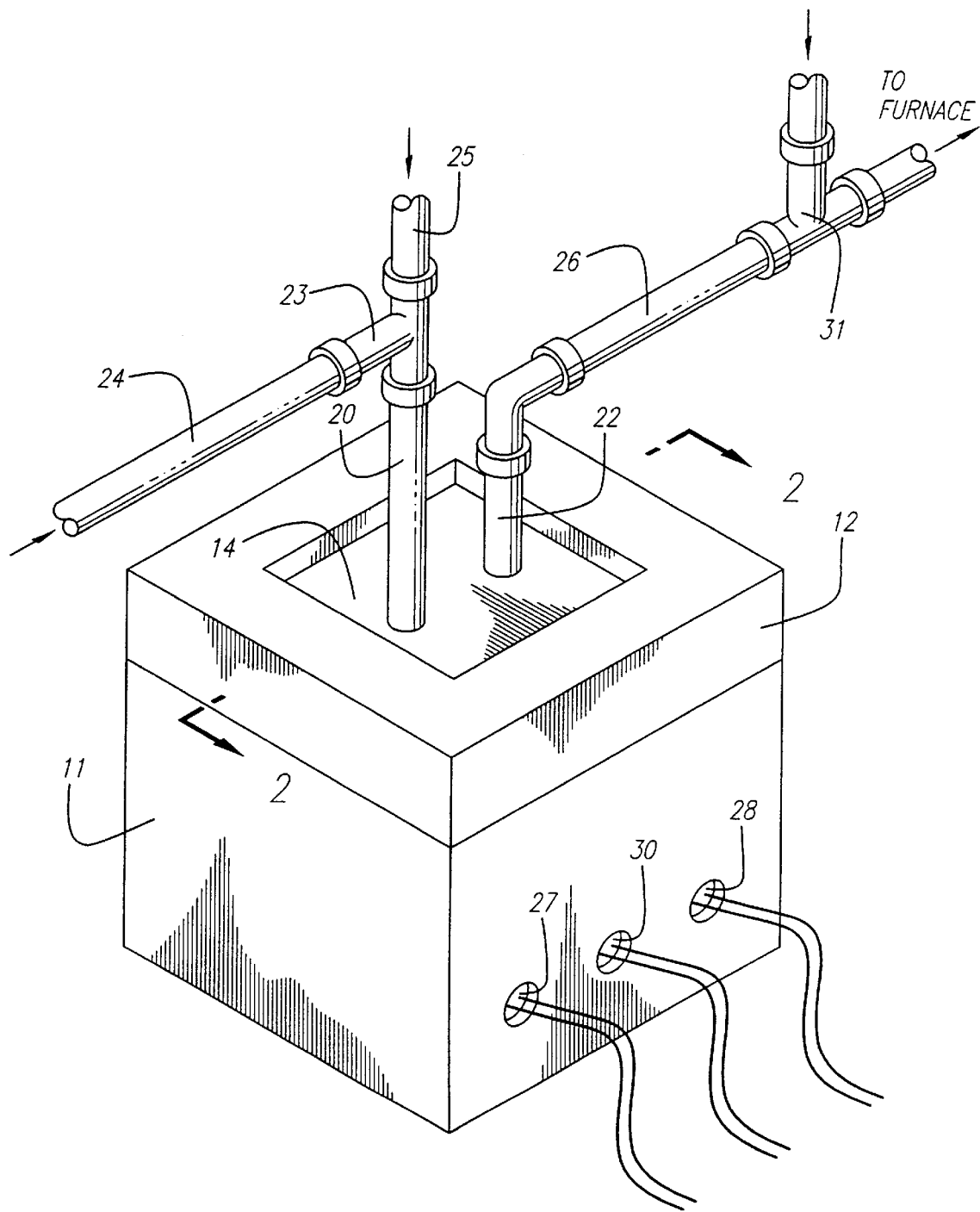
FIG. 1 is a view in perspective showing one embodiment of the invention.

Referring now to FIG. 1, the present invention is shown as it appears in the workplace positioned near a semiconductor processing furnace. The apparatus delivers the stream of oxygen and water vapor used in the wet oxygen oxidation of silicon wafers. Since oxidation of the silicon wafer proceeds much more rapidly in water vapor than in dry oxygen, the water content is an important variable for determining oxide thickness for a given time and furnace temperature. The ratio of the two oxidizing species once established is to be maintained or alternatively carefully controlled to provide predictable and reproducible grown oxide layer thickness.

Figure 2:
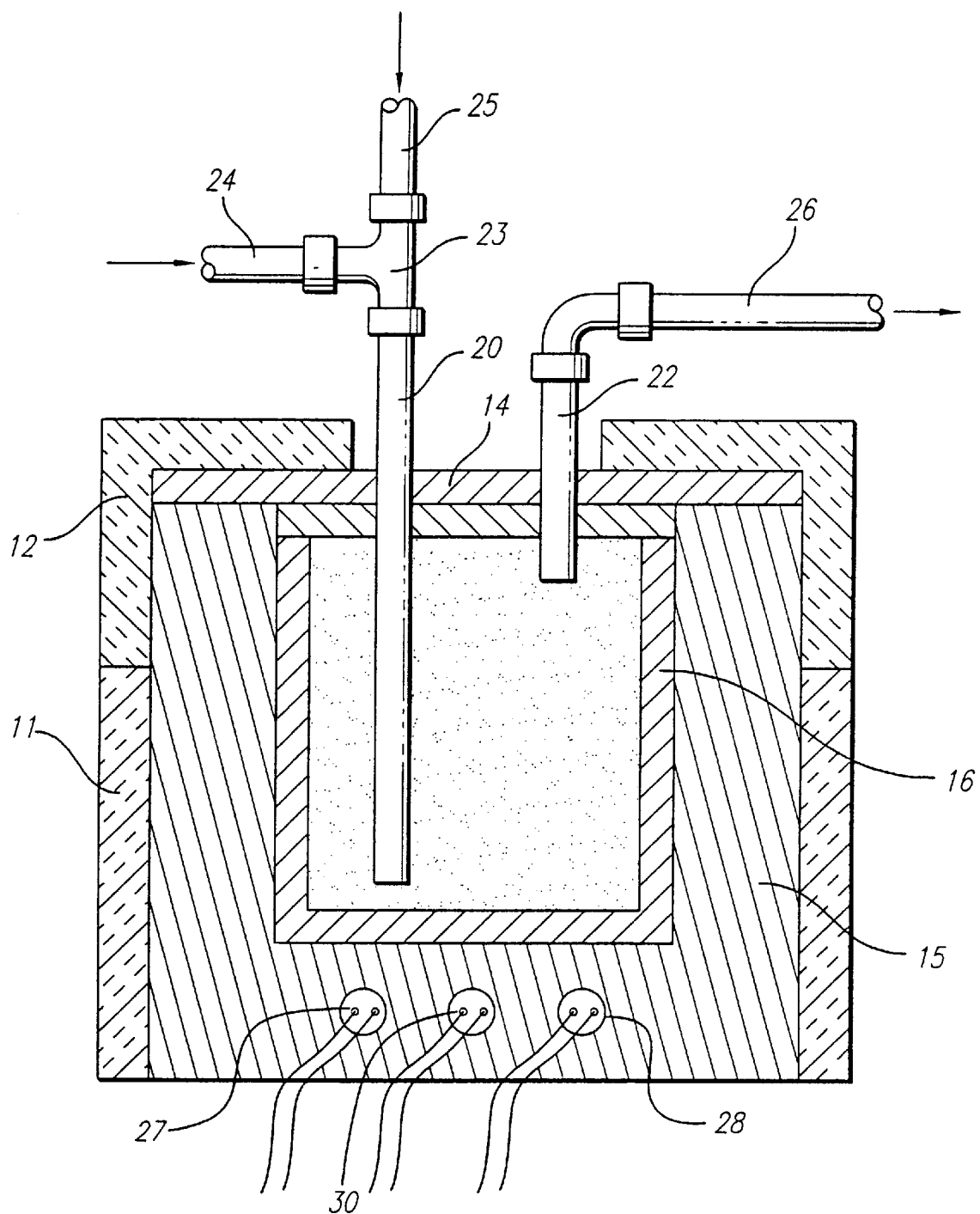
FIG. 2 is a view in cross-section of the embodiment of FIG. 1.

The apparatus is comprised of an inner vessel 16 nested in and contacting an aluminum block 15 having a cover plate 14 and shown in the cross-sectional view of FIG. 2. The outer covering of the aluminum block includes a bottom section 11 of insulating material and a removable top cover 12 therefor. The insulating material in the embodiment shown is calcium silicate. An open top portal in the top cover 12 provides access to the input and output tubes 20 and 22 respectively. The input tube 20 extends to a Tee section 23 which is coupled to the oxygen gas input line 25 and the water input line 24. Typically, the oxygen is pure and dry from a tank while the water is deionized water at room temperature from an external reservoir. The input flow rates of both materials are regulated externally in accordance with the desired layer thickness and rate of diffusion of the wet oxygen supplied to the furnace via output line 26. Once established, the ratio of oxygen and water is maintained constant by the apparatus during the 2 to 24 hour period in which the wet oxygen stream is supplied to the furnace. Any variation in the ratio is brought about by the use of external controls.

The bottom section 11 of insulating material contains three ports near the bottom which provide access to the base region of the aluminum block 15. The two larger ports 27 and 28 receive rod heaters which extend across the bottom of the block 15. The block is made of high thermal conductivity material so that the heat generated is conducted throughout the body. The central port 30 receives a thermocouple to provide an indicator of the block temperature. The temperature of the block 15 in the embodiment shown is taken to 450° C. to promote instant vaporization of the oxygen-water stream supplied through the input tube 20.

Turning now to FIG. 2, the input tube 20 extends downwardly in vessel 16 to a position proximate to the bottom of the vessel. The vessel is substantially filled with pieces of inert material, typically quartz chips, which are heated to the same temperature as the vessel. The output tube 22 extends only a relatively short distance into the vessel. The tubes 20 and 22 are made of quartz and they are fused to quartz cover 17 which is then fused to the quartz vessel 16. The external fittings for tubes 20 and 22 are typically made of Teflon or like material. The quartz vessel 16 is covered with a thin protective aluminum cover extending thereacross.

In operation, the semiconductor furnace is normally heated to about 600° C., silicon wafers added, purged and sealed with an end cap. Then, the furnace temperature is elevated to 1000° C. At this time, a stream of dry oxygen is often used for a brief period of 5 minutes to form an initial oxide layer on the wafers. The vessel has been heated to 450° C. and the input tube receives an initial dry oxygen input stream. Following the initial layer formation, the deionized water is introduced along with the oxygen into the vessel.

The water entering the vessel with the oxygen is immediately vaporized by the heated quartz chips and the two oxidizing species are mixed. As a result, no residue of excess water collects at the bottom of the vessel and the oxygen gas is not traveling through a column of water of variable length. Also, the high temperatures along with the thermal inertia of the mass of heated chips prevents any spattering of liquid occurring at the end of the input tube 20 which can produce variation of the ratio of oxygen and water vapor supplied to the output tube 22.

The embodiment shown in FIGS. 1 and 2 utilized a round quartz vessel that is 3 inches in diameter. The square cross-section of the aluminum body is 4 inches on a side thereby providing at least one-half inch of material is adjacent the wall of the vessel. The calcium silicate insulation is 1 inch thick. After heating to 450° C., the apparatus provided a reproducible and controllable oxide layer growth for periods of 2 to 24 hours. At the conclusion of the oxide layer growth, the introduction of water at input tube 20 is stopped. A 5 minute run of dry oxygen to the furnace is continued to densify the oxide layer.

As mentioned previously, the present invention is well-suited for use in the deposition of oxide films on semiconductor wafers. The gas stream is nitrogen and serves as a carrier for liquid TEOS when mixed at the input. The TEOS is immediately vaporized when it contacts the heated quartz chips so that the amount of TEOS being provided at the output remains constant. Oxygen is supplied to the output line at a controlled rate prior to the output stream being supplied to the furnace.

While the foregoing description has referred to a specific embodiment of the invention, it is recognized that modifications and variations may be made therein without departing from the scope of the invention.

What is claimed is:

1. Apparatus for generating a high temperature mixture of gases, the stream being supplied to a furnace for the production of oxide films on semiconductor wafers, said apparatus comprising:
   a) an open quartz vessel;
   b) a quartz cover having input and output ports and dimensioned to close the vessel;
   c) an input tube extending from the input port to a level proximate to the bottom of the vessel;
   d) means for delivering a mixture of gas and liquid to the input tube;
   e) an output tube extending from the output port to a region proximate to the cover;
   f) a multiplicity of inert chips contained in the vessel and surrounding the input tube;
   g) a body of high thermal conductivity material having a central opening for receiving and contacting the vessel; and
   h) means for heating the body and elevating the temperature of the vessel and inert chips therein, the mixture of gas and liquid being vaporized and exiting the vessel through the output tube.

2. The apparatus in accordance with claim 1 wherein said gas is oxygen and said liquid is water vapor.

3. The apparatus in accordance with claim 2 wherein said inert chips are quartz chips.

4. The apparatus of claim 3 wherein said means for heating the body elevates the temperature of the vessel and quartz chips to 450° C.

5. The apparatus of claim 4 wherein said means for heating the body is located within the body.

6. The apparatus of claim 5 further comprising a shield of insulating material substantially enclosing the body of high thermal conductivity material.

7. The apparatus of claim 6 further comprising a cover of like material overlying the body and having openings in alignment with the input and output ports.

8. The apparatus of claim 7 wherein said input tube extends upwardly from the input port, said tube having separate branches for the introduction of water and oxygen into the vessel.

9. The apparatus of claim 8 wherein said body is formed of aluminum.

10. The apparatus of claim 1 wherein said gas is nitrogen and said liquid is tetraethyl orthosilicate.

11. The apparatus of claim 10 further comprising a supply tube communicating with said output tube for providing oxygen to the mixture exiting the vessel.

\* \* \* \* \*